(12) United States Patent
Ahn et al.

(10) Patent No.: US 9,450,122 B2
(45) Date of Patent: Sep. 20, 2016

(54) LATERAL TYPE PHOTODIODE, IMAGE SENSOR INCLUDING THE SAME, AND METHOD OF MANUFACTURING THE PHOTODIODE AND THE IMAGE SENSOR

(71) Applicant: Samsung Electronics Co., Ltd., Suwon-si, Gyeonggi-do (KR)

(72) Inventors: Jihoon Ahn, Yongin-si (KR); Yongwoo Jeon, Seoul (KR); Jungwoo Kim, Hwaseong-si (KR); Haeseok Park, Yongin-si (KR); Seungeon Ahn, Hwaseong-si (KR); Seunghyup Lee, Yongin-si (KR); Myounghoon Jung, Bucheon-si (KR); Hyuksoon Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/711,420

(22) Filed: May 13, 2015

(65) Prior Publication Data

US 2015/0333202 A1 Nov. 19, 2015

(30) Foreign Application Priority Data

May 14, 2014 (KR) .......................... 10-2014-0057952

(51) Int. Cl.
| H01L 31/102 | (2006.01) |
| H01L 31/0336 | (2006.01) |
| H01L 31/0352 | (2006.01) |
| H01L 31/18 | (2006.01) |
| H01L 31/105 | (2006.01) |

(52) U.S. Cl.
CPC ....... *H01L 31/0336* (2013.01); *H01L 31/0352* (2013.01); *H01L 31/035281* (2013.01); *H01L 31/105* (2013.01); *H01L 31/18* (2013.01); *H01L 31/1852* (2013.01); *Y02P 70/521* (2015.11)

(58) Field of Classification Search
CPC ............. H01L 31/105; H01L 31/1852; H01L 31/0336; H01L 31/035281

USPC .......................................... 257/184
See application file for complete search history.

(56) References Cited

U.S. PATENT DOCUMENTS

| 6,489,635 | B1 | 12/2002 | Sugg |
| 6,555,890 | B2 | 4/2003 | Dries et al. |
| 6,807,327 | B2 | 10/2004 | Masuda |
| 6,872,992 | B2 | 3/2005 | Muramatsu |
| 7,307,290 | B2 | 12/2007 | Iwasaki et al. |
| 7,535,033 | B2 | 5/2009 | Dutta |
| 8,022,449 | B2 | 9/2011 | Nagai |
| 2007/0099315 | A1* | 5/2007 | Maa ...................... H01L 31/105 438/22 |
| 2008/0121928 | A1 | 5/2008 | Niigaki et al. |
| 2009/0039361 | A1* | 2/2009 | Li ..................... H01L 21/02381 257/94 |
| 2009/0179291 | A1 | 7/2009 | Nam et al. |
| 2010/0065896 | A1 | 3/2010 | Lee et al. |
| 2010/0078680 | A1* | 4/2010 | Cheng ............... H01L 27/14612 257/184 |
| 2012/0001305 | A1 | 1/2012 | Peroni et al. |
| 2012/0326122 | A1 | 12/2012 | Fujii et al. |

FOREIGN PATENT DOCUMENTS

| JP | 2003124222 A | 4/2003 |
| KR | 101257604 B1 | 4/2013 |

* cited by examiner

*Primary Examiner* — Matthew Gordon
(74) *Attorney, Agent, or Firm* — Harness, Dickey & Pierce, P.L.C.

(57) ABSTRACT

Example embodiments relate to a lateral type photodiode including a substrate, an insulation mask layer formed on the substrate, and a first type semiconductor layer, an active layer, and a second type semiconductor layer that contact a surface of the insulation mask layer and that are sequentially disposed in a direction substantially parallel to the surface of the insulation mask layer. The insulation mask layer includes a through hole, and the first type semiconductor layer, the active layer, and the second type semiconductor layer are sequentially formed from the through hole by using a lateral overgrowth method.

9 Claims, 18 Drawing Sheets

LATERAL TYPE PHOTODIODE, IMAGE SENSOR INCLUDING THE SAME, AND METHOD OF MANUFACTURING THE PHOTODIODE AND THE IMAGE SENSOR

RELATED APPLICATION

This application claims the benefit of priority from Korean Patent Application No. 10-2014-0057952, filed on May 14, 2014, in the Korean Intellectual Property Office, the disclosure of which is incorporated herein in its entirety by reference.

BACKGROUND

1. Field

Example embodiments relate to group III-V compound semiconductor-based photodiodes, image sensors including the photodiodes, and/or methods of manufacturing the photodiodes and the image sensors.

2. Description of the Related Art

An image sensor is a semiconductor device that converts an optical image to an electrical signal and that is typically used in various fields such as cameras, motion recognition cameras, and touch panels.

The image sensor includes a light receiving element that senses light and converts the light to an electrical signal and a readout circuit that processes the electrical signal to form the same to data.

A photodiode based on a group III-V compound semiconductor is used as the light receiving element of the image sensor, and a silicon-based readout integration circuit (ROIC) is used as a readout circuit of the photodiode.

To implement an image sensor including the silicon-based readout integration circuit (ROIC) and the photodiode based on a group III-V compound semiconductor, a hybrid structure or monolithic structure may be employed.

According to the hybrid structure, a photodiode and a readout circuit are manufactured on different wafers and are then bonded. Thus, a number of complicated manufacturing processes are used, and it is often difficult to align the photodiode and the readout circuit.

According to the monolithic structure, a single wafer is divided into areas to manufacture a photodiode and a readout circuit on the wafer. With the increase in a resolution of an image sensor, a pixel size is reduced, and accordingly, a light receiving area in a pixel is also reduced. Moreover, since it is difficult to reduce a size of the readout circuit, a ratio of the light receiving area in the pixel is gradually reduced as the pixel size is reduced. Accordingly, in order to provide a high image quality and a high resolution, the light receiving area in the pixel may be increased.

SUMMARY

Example embodiments relate to image sensors in which a ratio of a light receiving area in a unit pixel may be increased, and a method of manufacturing the same.

Additional example embodiments will be set forth in part in the description which follows and, in part, will be apparent from the description, or may be learned by practice of the example embodiments.

According to example embodiments, a lateral type photodiode includes a substrate, an insulation mask layer formed on the substrate, and a first type semiconductor layer, an active layer, and a second type semiconductor layer that contact a surface of the insulation mask layer and that are disposed, for example sequentially disposed, in a direction substantially parallel to the surface of the insulation mask layer.

The substrate may include a silicon substrate.

The insulation mask layer may be formed of or include an oxide or a nitride.

A through hole may be formed in the insulation mask layer.

One of the first type semiconductor layer and the second type semiconductor layer may extend from the through hole to a portion on the insulation mask layer.

The lateral type photodiode may further include a seed layer formed between the substrate and the insulation mask layer.

The first type semiconductor layer, the active layer, and the second semiconductor layer may be formed of or include a group III-V compound semiconductor material.

According to at least one example embodiment, an image sensor includes a silicon substrate, a read out integrated circuit (ROIC) formed on the silicon substrate, an insulation mask layer that covers the ROIC, wherein at least one through hole is formed in the insulation mask layer, a first type semiconductor layer that is grown from the through hole and that extends along a surface of the insulation mask layer, an active layer that contacts the first type semiconductor layer, and a second type semiconductor layer that contacts the active layer.

The first type semiconductor layer, the active layer, and the second type semiconductor layer may contact the surface of the insulation mask layer and may be disposed, for example sequentially disposed, in a direction substantially parallel to the surface of the insulation mask layer.

The active layer may surround a lateral surface of the first type semiconductor layer, and the second type semiconductor layer may surround a lateral surface of the active layer.

The active layer may be formed of or include two areas that are disposed along two opposite directions from two facing lateral surfaces of the first type semiconductor layer, and the second type semiconductor layer may be formed of or include two areas that are disposed along the two opposite directions from two ends of the two areas of the active layer.

The active layer and the second type semiconductor layer may be stacked, for example sequentially stacked, on the first type semiconductor layer in a direction substantially perpendicular to the surface of the insulation mask layer.

The insulation mask layer may be formed of or include an oxide or a nitride.

A seed layer may be formed in the through hole.

When projecting the ROIC and the active layer to a surface of the substrate, projected areas of the ROIC and the active layer may be overlapped.

The first type semiconductor layer, the active layer, and the second type semiconductor layer may be formed of or include a group III-V compound semiconductor material.

According to at least one example embodiment, a light sensing pixel includes a substrate, an ROIC on the substrate, and a light receiving structure on the ROIC, the light receiving structure having a light receiving area that includes a substantial entirety of an upper surface of the light receiving structure opposite the ROIC.

According to at least one example embodiment, a method of manufacturing a lateral type photodiode includes forming an insulation mask layer having a through hole on a substrate, growing a first type semiconductor layer by using an epitaxial lateral overgrowth (ELOG) method such that the first type semiconductor layer extends from the through hole along a surface of the insulation mask layer, growing an active layer, by using the ELOG method, from a lateral surface of the first type semiconductor layer in a direction substantially parallel to the surface of the insulation mask layer, and growing a second type semiconductor layer, by using the ELOG method, from a lateral surface of the active layer in a direction substantially parallel to the surface of the insulation mask layer.

The method may further include planarizing the first type semiconductor layer, the active layer, and the second type semiconductor layer such that upper surfaces of the first type semiconductor layer, the active layer, and the second type semiconductor layer are on the same plane.

The method may further include, before forming the insulation mask layer, forming a seed layer on the substrate.

According to at least one example embodiment, a method of manufacturing an image sensor includes preparing a silicon substrate on which a read out integrated circuit (ROIC) is formed, forming an insulation mask layer that covers the ROIC, wherein a through hole exposing a surface of the silicon substrate is formed in the insulation mask layer, growing a first type semiconductor layer, by using an epitaxial lateral overgrowth (ELOG) method, such that the first type semiconductor layer extends from an inner portion of the through hole along a surface of the insulation mask layer, forming an active layer that contacts the first type semiconductor layer, and forming a second type semiconductor layer that contacts the active layer.

In the forming of an active layer, an active layer may be grown from a lateral surfaced of the first type semiconductor layer in a direction substantially parallel to the surface of the insulation mask layer, by using the ELOG method, and, in the forming of a second type semiconductor layer, a second type semiconductor layer may be grown from a lateral surface of the active layer in a direction substantially parallel to the surface of the insulation mask layer, by using the ELOG method.

When forming the active layer and the second type semiconductor layer, lateral overgrowth may be directed from a lateral surface of the first type semiconductor layer in a radial direction.

When forming the active layer and the second type semiconductor layer, lateral overgrowth may be directed from a lateral surface of the first type semiconductor layer in two opposite directions.

The method may further include planarizing the first type semiconductor layer, the active layer, and the second semiconductor layer such that upper surfaces of the first type semiconductor layer, the active layer, and the second semiconductor layer are on the same plane.

The method may further include forming a passivation layer that covers the first type semiconductor layer, the active layer, and the second semiconductor layer that are planarized.

The method may further include forming a through hole in the passivation layer such that portions of the first type semiconductor layer and the second type semiconductor layer are exposed, and forming a first contact layer and a second contact layer that respectively contact the first type semiconductor layer and the second semiconductor layer through the through hole.

The active layer and the second type semiconductor layer may be formed, for example sequentially formed, on the first type semiconductor layer in a direction substantially perpendicular to the surface of the insulation mask layer.

BRIEF DESCRIPTION OF THE DRAWINGS

These and/or other example embodiments will become apparent and more readily appreciated from the following description, taken in conjunction with the accompanying drawings in which.

DETAILED DESCRIPTION

Figure 1:
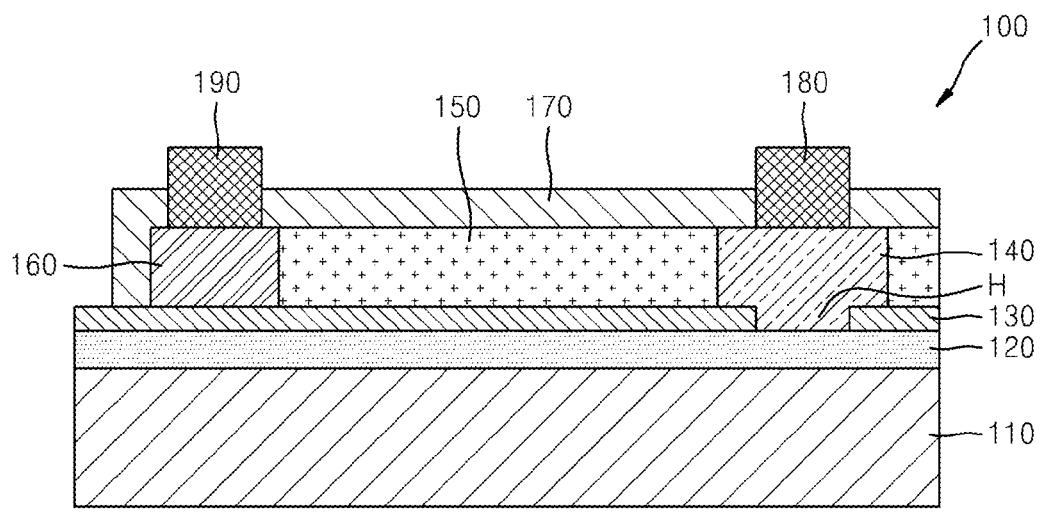
FIG. 1 is a schematic cross-sectional view of a lateral type photodiode according to at least one example embodiment.

Reference will now be made in detail to example embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain the present description. Expressions such as "at least one of," when preceding a list of elements, modify the entire list of elements and do not modify the individual elements of the list.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Since the example embodiments may have various modifications and several embodiments, example embodiments are shown in the drawings and will be described in detail. Advantages, features, and a method of achieving the same will be specified with reference to the example embodiments described below in detail together with the attached drawings. However, the example embodiments may have different forms and should not be construed as being limited to the descriptions set forth herein.

The example embodiments will be described below in more detail with reference to the accompanying drawings. Those components that are the same or are in correspondence are rendered the same reference numeral regardless of the figure number, and redundant explanations are omitted.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Singular expressions, unless defined otherwise in contexts, include plural expressions.

In the embodiments below, it will be further understood that the terms "comprise" and/or "have" used herein specify the presence of stated features or components, but do not preclude the presence or addition of one or more other features or components.

Also, in the drawings, for convenience of description, sizes of elements may be exaggerated or contracted. In other words, since sizes and thicknesses of components in the drawings are arbitrarily illustrated for convenience of explanation, the following embodiments are not limited thereto.

When an embodiment is implementable in another manner, a desired, or alternatively predetermined process order may be different from a described one. For example, two processes that are consecutively described may be substantially simultaneously or contemporaneously performed or may be performed in an opposite order to the described order.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

FIG. 1 is a schematic cross-sectional view of a lateral type photodiode 100 according to at least one example embodiment.

The lateral type photodiode 100 includes a substrate 110, an insulation mask layer 130 formed on the substrate 110, a first type semiconductor layer 140, an active layer 150, and a second type semiconductor layer 160, which are substantially laterally arranged on a surface of the insulation mask layer 130. A seed layer 120 may be further disposed between the substrate 110 and the insulation mask layer 130. According to various example embodiments, the first type semiconductor layer 140, the active layer 150 and the second type semiconductor layer 160 form a light receiving structure.

The substrate 110 may be formed of or include various materials such as a semiconductor material or a polymer material. Examples of the semiconductor material may include Si, Ge, GaAs, and GaN, and examples of the polymer material may include an organic polymer and an inorganic polymer. Also, the substrate 110 may be formed of or include quartz or glass.

The seed layer 120 may be formed of or include the same or similar material as a semiconductor material that is to be formed on the seed layer 120. However, the seed layer 120 may be omitted according to the material of the substrate 110 and the first type semiconductor layer 140.

The insulation mask layer 130 may be formed of or include an oxide or a nitride. A through hole H is formed in the insulation mask layer 130 so that a portion of the seed layer 120, or if the seed layer 120 is not formed, a portion of the substrate 110, is exposed through the through hole H.

The first type semiconductor layer 140 extends from an inner portion of the through hole H along an upper surface of the insulation mask layer 130.

The active layer 150 extends from a lateral surface of the first type semiconductor layer 140 and in a direction substantially parallel to the upper surface of the insulation mask layer 130.

The second type semiconductor layer 160 extends from a lateral surface of the active layer 150 and in a direction substantially parallel to the upper surface of the insulation mask layer 130.

The first type semiconductor layer 140, the active layer 150, and the second type semiconductor layer 160 are formed of or include a semiconductor material such as a group III-V compound semiconductor. One of the first type semiconductor layer 140 and the second type semiconductor layer 160 may be doped with N-type impurities, and the other may be doped with P-type impurities, and the active layer 150 may not be doped. Thus, a P-I-N structure may be formed. Si, Ge, Se, Te, or the like may be used as an N-type impurity. Mg, Zn, Be, or the like may be used as a P-type impurity. A material and a composition ratio of the active layer 150 are determined according to light of a wavelength band that is to be detected by using the lateral type photodiode 100.

Also, a passivation layer 170 that covers the first type semiconductor layer 140, the active layer 150, and the second type semiconductor layer 160 may be formed. The passivation layer 170 may be patterned such that portions of the first type semiconductor layer 140 and the second type semiconductor layer 160 are exposed so that a first contact layer 180 and a second contact layer 190 may be respectively formed on the first type semiconductor layer 140 and the second type semiconductor layer 160.

The lateral type photodiode 100 having the above-described structure may be formed, for example, by using an epitaxial lateral overgrowth (ELOG) method. According to the ELOG method, a semiconductor material may be grown such that lateral growth thereof is faster than vertical growth thereof.

Figure 2:
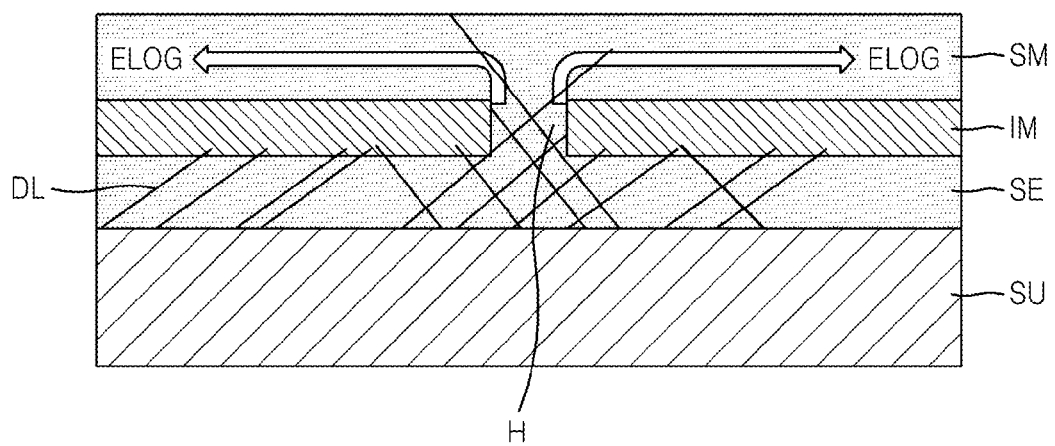
FIG. 2 is a conceptual diagram illustrating a lateral overgrowth method used in the manufacture of the lateral type photodiode of FIG. 1 and thin films having small defects, which are manufactured by using the lateral overgrowth method.

FIG. 2 is a conceptual diagram illustrating a lateral overgrowth method used in the manufacture of the lateral type photodiode 100 of FIG. 1 and thin films having small defects, which are manufactured by using the lateral overgrowth method.

A seed layer SE and an insulation mask layer IM having a through hole H are formed on a substrate SU. The seed layer SE is formed of or include a material that is similar to or the same as a semiconductor material SM that is to be grown, and may be omitted according to a material of the substrate SU.

The insulation mask layer IM may function as an ELOG mask. The seed layer SE has defects such as dislocation DL due to a difference in coefficients of thermal expansion or lattice constants of materials of the substrate SU and the seed layer SE. However, when the semiconductor material SM is grown from the seed layer SE through the through hole H, dislocation evolution does not easily occur due to the through hole H which has a small size, and thus, the semiconductor material SM formed on an upper surface of the insulation mask layer IM may have a relatively small defect.

When forming the semiconductor material SM by using the ELOG method, a typical semiconductor manufacturing process, such as a hydride vapor phase epitaxy (HVPE) method, a molecular beam epitaxy (MBE) method, a metal organic vapor phase epitaxy (MOVPE) method, a metal organic chemical vapor deposition (MOCVD) method or the like is used, and it is known that a ratio of lateral growth with respect to vertical growth may be up to about 10.

By using the ELOG method as described above, a P-I-N structure may be formed on an insulation material which is a material from which a semiconductor material is typically not grown.

Figure 3:
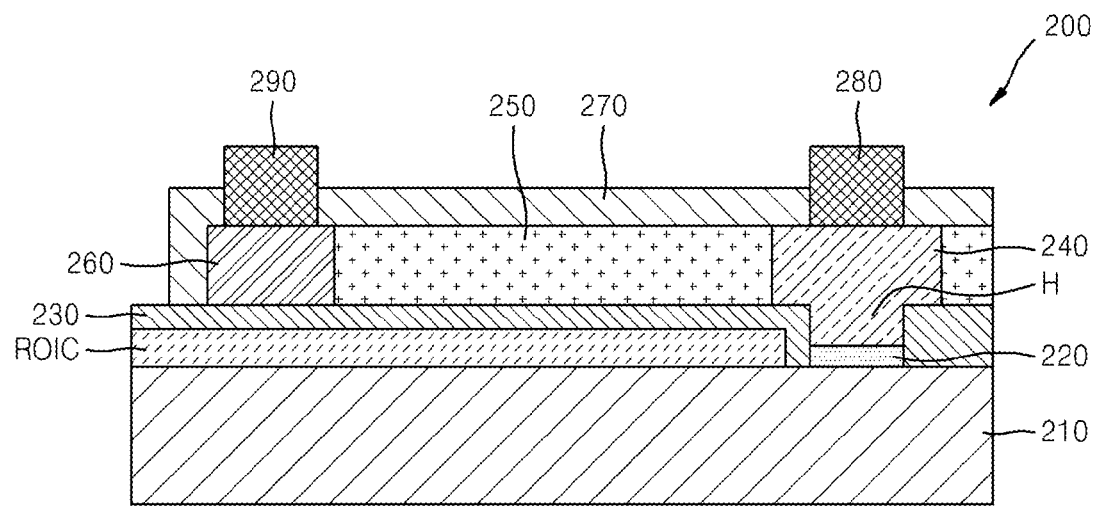
FIG. 3 is a schematic cross-sectional view of an image sensor according to at least one example embodiment.

FIG. 3 is a schematic cross-sectional view of an image sensor 200 according to at least one example embodiment.

The image sensor 200 includes a light receiving element and a readout integrated circuit (ROIC) that reads an electrical signal from the light receiving element and forms the electrical signal to an image. According to at least one example embodiment, the light receiving element having a lateral P-I-N structure as described above is formed on an insulation material that covers the ROIC.

A structure of the image sensor 200 will be described in detail below.

The image sensor 200 includes a silicon substrate 210, a ROIC unit formed on the silicon substrate 210, an insulation mask layer 230 in which at least one through hole H is formed, a first type semiconductor layer 240, an active layer 250, and a second type semiconductor layer 260 that contact a surface of the insulation mask layer 230 and that are disposed, for example sequentially disposed, along the surface of the insulation mask layer 230. Also, the image sensor 200 includes a passivation layer 270 that protects the first type semiconductor layer 240, the active layer 250, and the second type semiconductor layer 260 and a first contact layer 280 and a second contact layer 290 that respectively contact the first type semiconductor layer 240 and the second type semiconductor layer 260.

The ROIC unit is formed of or includes a circuit element that reads out an electrical signal generated by light absorbed in the active layer 250, and includes at least one transistor and at least one capacitor, a plurality of wiring structures, or the like.

The insulation mask layer 230 is formed of or includes an oxide or a nitride and passivates the ROIC unit. Also, the insulation mask layer 230 functions as an ELOG mask and to this end, the insulation mask layer 230 includes a through hole H.

The seed layer 220 may be further formed in the through hole H. The seed layer 220 may be grown from the through hole H and may be formed of or include a material that is the same as or similar to a semiconductor material to be formed on the insulation mask layer 230, that is, a material that is the same as or similar to the material of the first type semiconductor layer 140. For example, the seed layer 220 may be formed of or include a group III-V compound semiconductor.

The first type semiconductor layer 240 extends from the through hole H to a portion on the insulation mask layer 230, and the active layer 250 and the second type semiconductor layer 260 extend from a lateral surface of the first type semiconductor layer 240 and in a direction substantially parallel to a surface of the insulation mask layer 230. However, the first type semiconductor layer 240 extending from the through hole H to the portion on the insulation mask layer 230 is described as an example, and the second type semiconductor layer 260 may also extend from the through hole H to the portion on the insulation mask layer 230.

The first type semiconductor layer 240, the active layer 250, and the second type semiconductor layer 260 are formed of or include a semiconductor material such as a group III-V compound semiconductor. One of the first type semiconductor layer 240 and the second type semiconductor layer 260 may be doped with N-type impurities and the other may be doped with P-type impurities, and the active layer 250 is not doped. Thus, a P-I-N structure is formed. Si, Ge, Se, Te, or the like may be used as an N-type impurity. Mg, Zn, Be, or the like may be used as a P-type impurity. Materials and composition ratios of the first type semiconductor layer 240, the active layer 250, and the second type semiconductor layer 260 are determined according to light of a wavelength band for which the image sensor 200 is used. For example, the first type semiconductor layer 240 and the second type semiconductor layer 260 may be formed of or include InP, and the active layer 250 may be formed of or include InGaAs so as to sense infrared light.

In this structure, areas of the ROIC and the active layer 250 that are projected to a surface of the substrate 210 may be overlapped so as to minimize a cross-section area of the image sensor 200. The illustrated structure corresponds to a single pixel. According to at least one example embodiment, a size of a single pixel of the image sensor 200 may be reduced or a surface area of a light receiving area in a single pixel of the image sensor 200 may be maximized.

Figure 4:
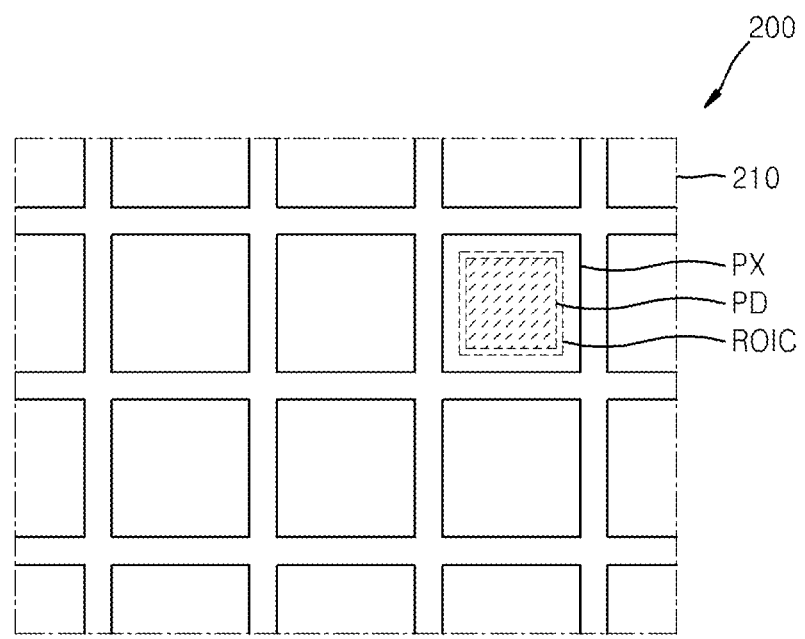
FIG. 4 is a plan view illustrating an arrangement relationship between a photodiode and a readout integrated circuit (ROIC) in a single pixel of an image sensor, according to at least one example embodiment.

FIG. 4 is a plan view illustrating an arrangement relationship between a photodiode and a ROIC in a single pixel of the image sensor 200 according to at least one example embodiment.

A plurality of pixels PX are included on the substrate 210, and a photodiode PD and a ROIC are formed in each of the pixels PX. The photodiode PD refers to a structure including the first type semiconductor layer 240, the active layer 250, and the second type semiconductor layer 260 of FIG. 3.

As illustrated in FIG. 4, the photodiode PD and the ROIC are disposed in different layers in a direction substantially perpendicular to a surface of the substrate 210. Thus, an area in a single pixel PX where the photodiode PD is formed is not affected by a size or a position of the ROIC. Accordingly, most of the area of the pixel PX may be used as light receiving area.

Figure 5A:
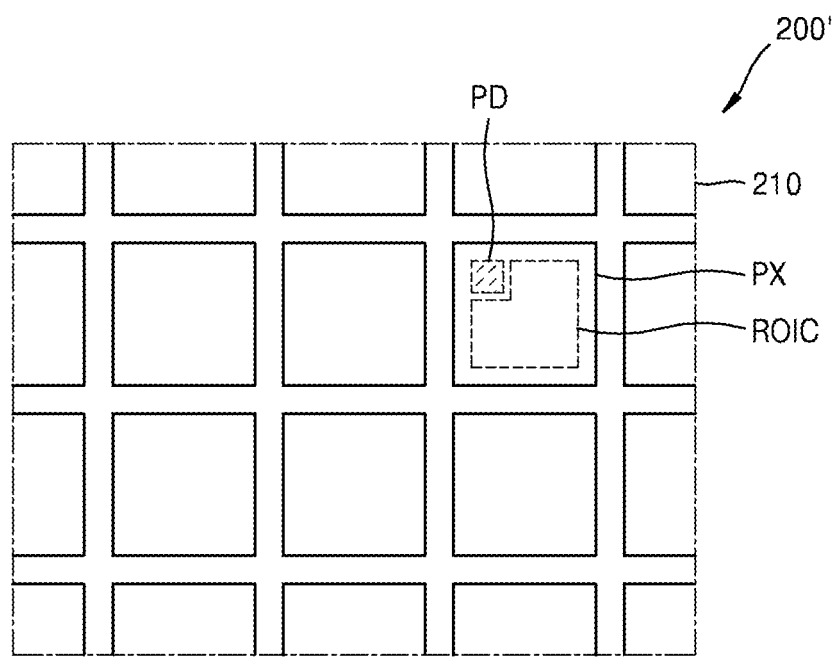
FIG. 5A is a plan view illustrating an arrangement relationship between a photodiode and a ROIC in a single pixel of an image sensor, according to a comparative example.
Figure 5B:
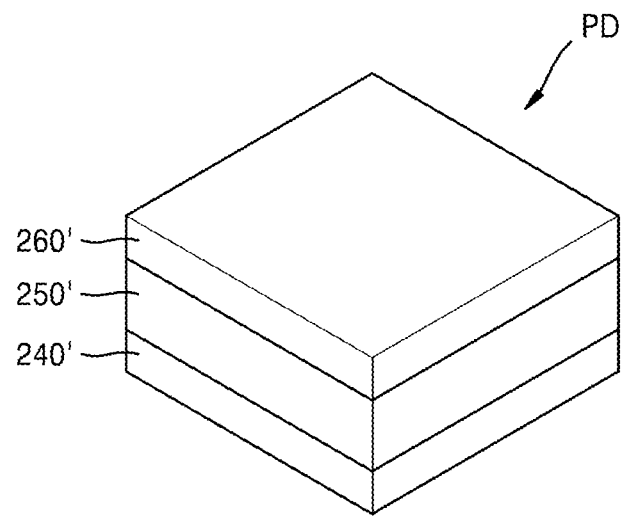
FIG. 5B illustrates a shape of a vertical type photodiode included in the image sensor according to the comparative example.

FIG. 5A is a plan view illustrating an arrangement relationship between a photodiode and a ROIC in a single pixel of the image sensor according to the comparative example. FIG. 5B illustrates a shape of a vertical type photodiode including an image sensor 200' according to a comparative example.

The image sensor 200' according to the comparative example uses a vertical photodiode PD; that is, as illustrated in FIG. 5B, a first type semiconductor layer 240', an active layer 250', and a second type semiconductor layer 260' are stacked. This structure is formed by using a vertical growth method, and as illustrated in FIG. 5A, a pixel area PX is shared with the ROIC.

Accordingly, a surface area of the photodiode PD with respect to a pixel PX of the same size is smaller for the comparative embodiment than for at least one example embodiment.

Figure 6:
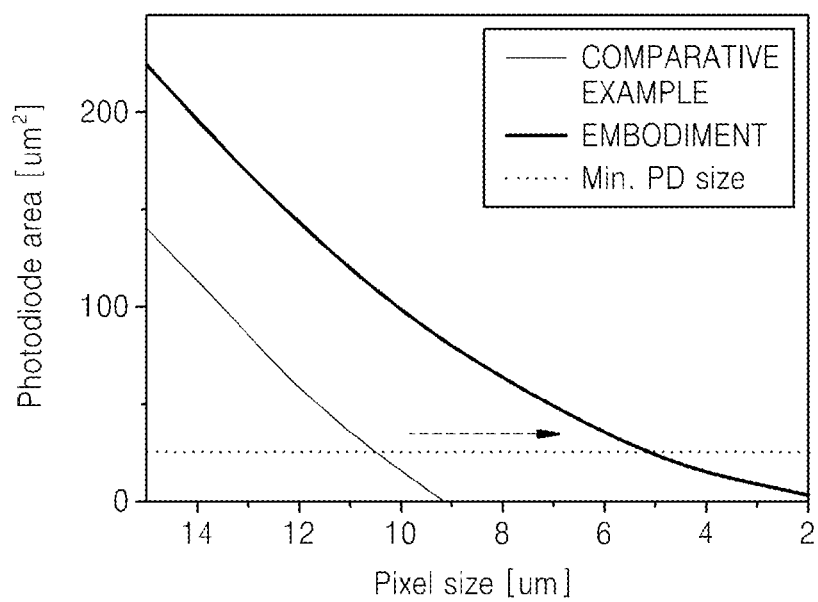
FIG. 6 is a graph showing a minimum pixel size that may be provided by the image sensors according to at least one example embodiment and the comparative example.

FIG. 6 is a graph showing a minimum pixel size that may be provided by the image sensors 200 and 200' according to at least one example embodiment and the comparative example.

Referring to FIG. 6, the smaller a pixel size in the comparative example and the example embodiment, the smaller the area of the photodiode. However, a minimum area of a light receiving area for sensing light is necessary. In the graph, the minimum light receiving area is denoted by a dotted line. A pixel size must provide the minimum light receiving area, that is, must have a pixel corresponding to an area above the dotted line of the graph, and thus has an implementable size. According to the comparative example, a minimum pixel is about 10 um, whereas according to the example embodiment, a minimum pixel is about 5 um, and thus, the image sensor according to the example embodiment is advantageous for realizing a high resolution.

Figure 7:
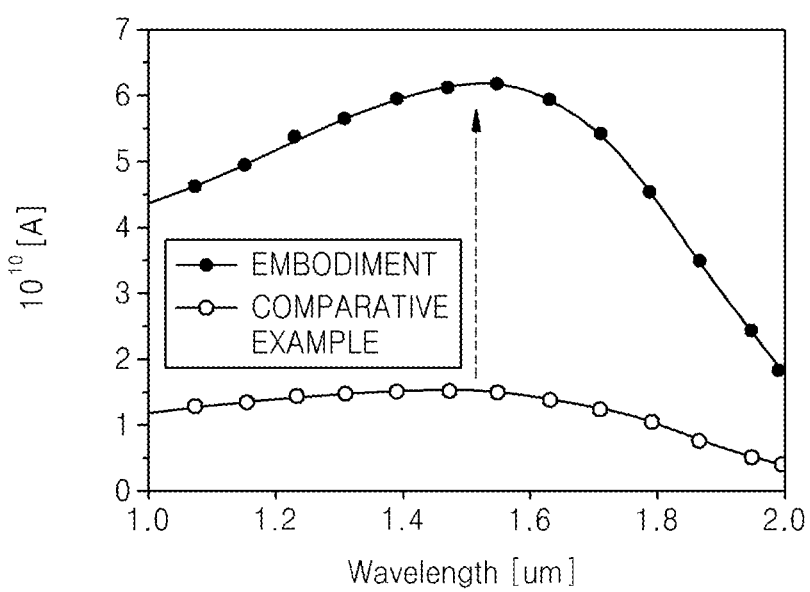
FIG. 7 is a graph comparing amplitudes of photocurrents according to wavelength in the image sensors according to at least one example embodiment and the comparative example.

FIG. 7 is a graph comparing amplitudes of photocurrents according to wavelength in the image sensors according to the present embodiment and the comparative example.

In the graph of FIG. 7, a pixel area of the comparative example and at least one example embodiment is both 100 um$^2$, and a photocurrent according to wavelengths is simulated. Referring to the graph of FIG. 7, a photocurrent that is five times as large for the example embodiment than for the comparative example is shown. This is because an area of a light receiving area according to the example embodiment is greater than for the comparative example.

Figure 8:
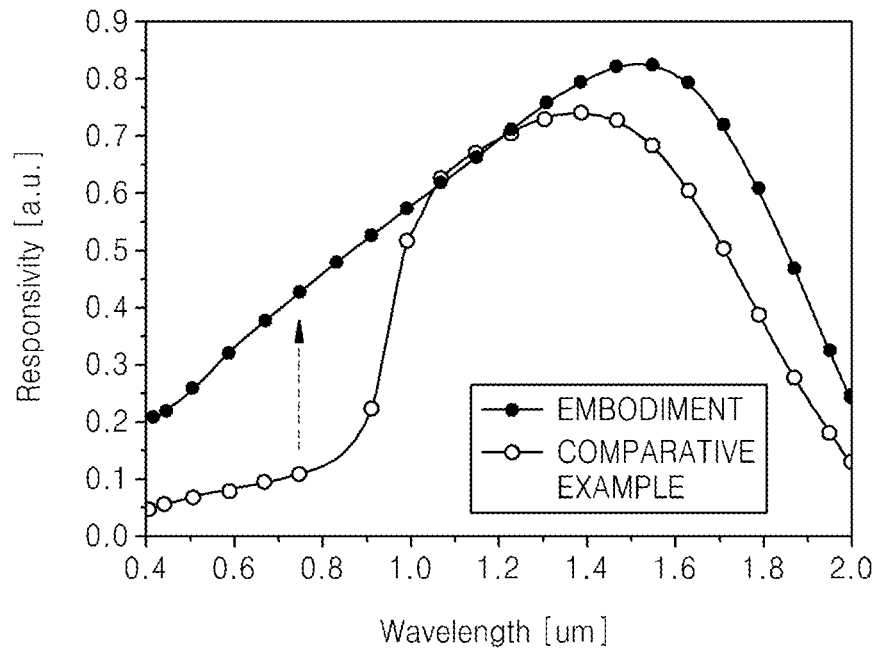
FIG. 8 is a graph comparing responsivity of the image sensors according to at least one example embodiment and the comparative example, according to wavelength.

FIG. 8 is a graph comparing responsivity of the image sensors according to at least one example embodiment and the comparative example, according to wavelength.

The image sensor 200' according to the comparative example has an arrangement as illustrated in FIGS. 5A and 5B, and the image sensor according to the example embodiment has the structure of FIG. 3, the P-I-N structure of the photodiodes is formed of or includes InP—InGaAs—InP, and responsivity of the image sensor was obtained by computer simulation.

Referring to FIG. 8, a higher responsivity is shown in the example embodiment in most wavelength bands than in the comparative example. In particular, a high responsivity is shown in a visible light band, and according to the example embodiment, it is considered that there is hardly any absorption of light in other layers before light is incident to an active layer. In the image sensor according to the comparative example, when light is incident to a vertical type photodiode, visible light is absorbed by InP in an upper portion, and thus an amount of light transferred to the active layer may be reduced. On the other hand, according to the example embodiment, light is incident to the lateral type photodiode, and here, absorption of visible light in other layers hardly occurs.

FIGS. 9 through 12 illustrate a detailed shape of a photodiode that may be included in the image sensor 200 according to at least one example embodiment.

In FIGS. 9 through 12, an arrow direction denotes a direction of lateral overgrowth.

Figure 9:
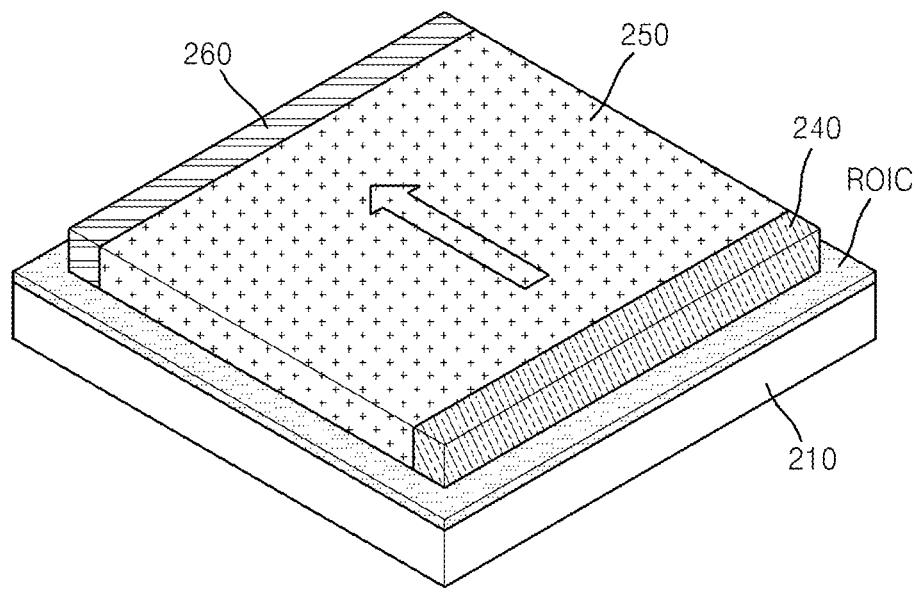
FIGS. 9 through 12 illustrate a detailed shape of a photodiode that may be included in an image sensor according to various example embodiments.

Referring to FIG. 9, the active layer 250 and the second type semiconductor layer 260 are disposed, for example sequentially disposed, in a direction from a lateral surface of the first type semiconductor layer 240.

Figure 10:
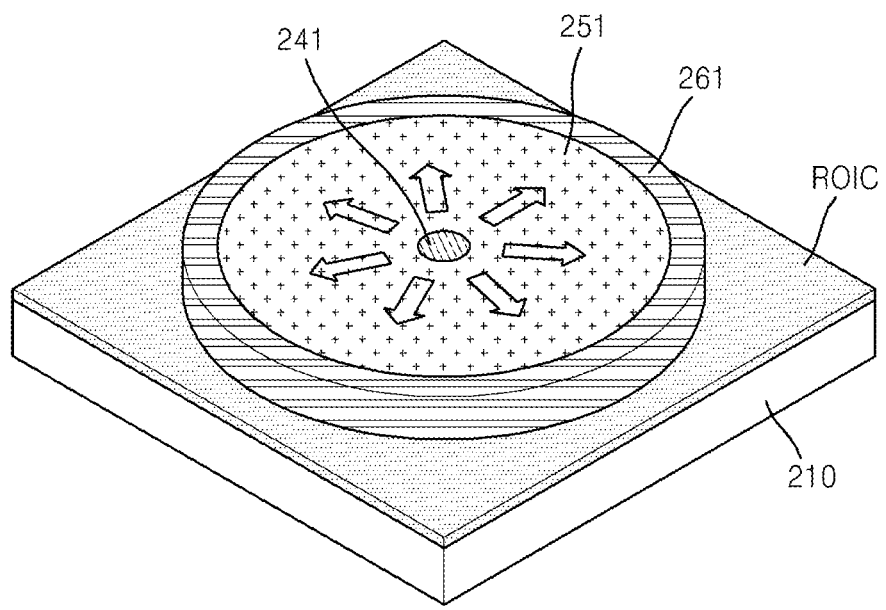

Referring to FIG. 10, an active layer 251 surrounds a first type semiconductor layer 241, and a second type semiconductor layer 261 surrounds the active layer 251. The illustrated shape is an annular ring, which may be formed by inducing lateral overgrowth in a radial direction from a lateral surface of the first type semiconductor layer 241.

Figure 11:
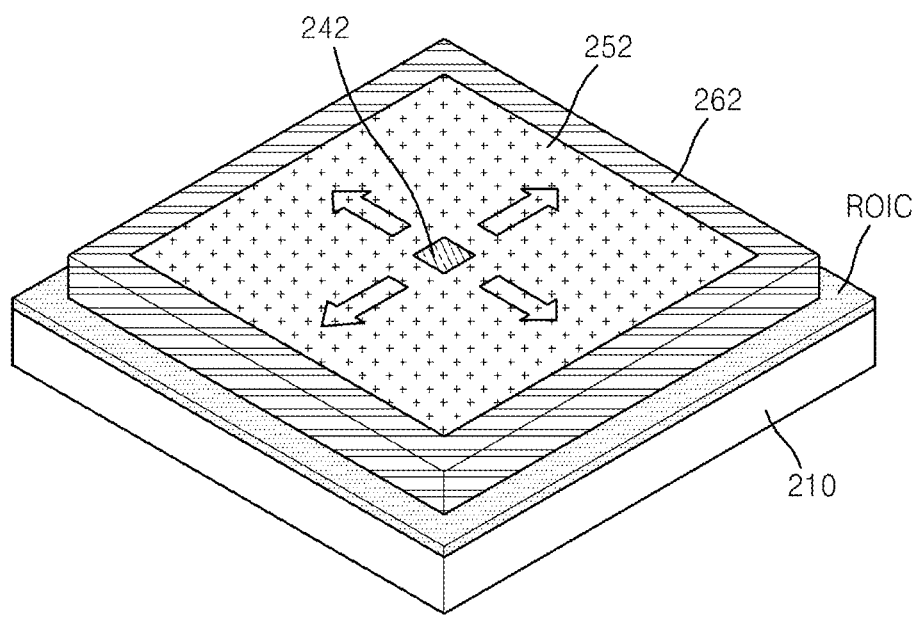

Referring to FIG. 11, an active layer 252 surrounds a first type semiconductor layer 242, and a second type semiconductor layer 262 surrounds the active layer 252. The illustrated shape is a rectangular ring, which may be formed by inducing lateral overgrowth in four substantially perpendicular directions from a lateral surface of a first type semiconductor layer 242.

Figure 12:
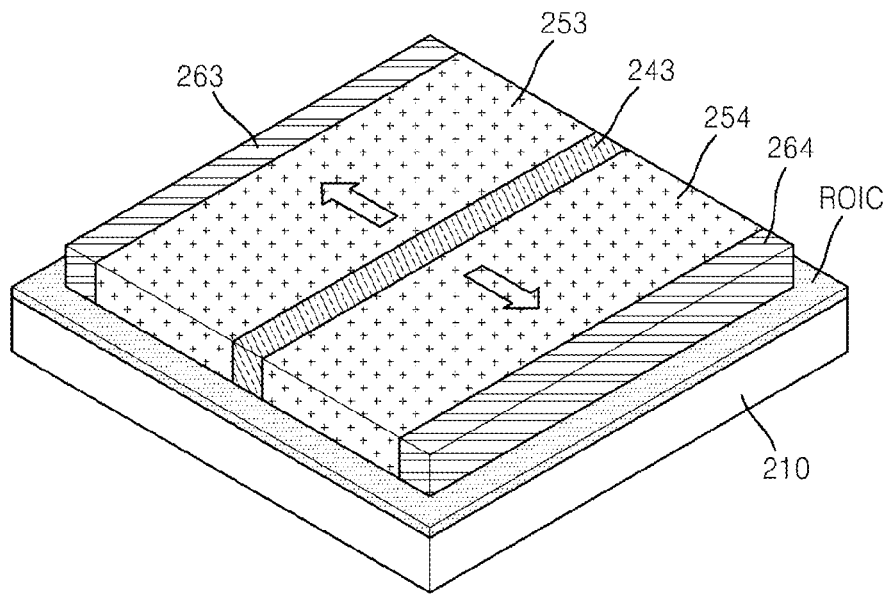

Referring to FIG. 12, an active layer is formed of or includes two areas 253 and 254 that are disposed in two opposite directions from two facing lateral surfaces of a first type semiconductor layer 243. Also, a second type semiconductor layer is formed of or includes two areas 263 and 264 that are disposed in the two opposite directions from two ends of the above two area 253 and 254 and that are included as the active layer. This structure may be formed by inducing lateral overgrowth along the two opposite directions from the two facing lateral surfaces of the first type semiconductor layer 243.

FIGS. 13A through 13H illustrate a method of manufacturing a photodiode according to at least one example embodiment.

Figure 13A:
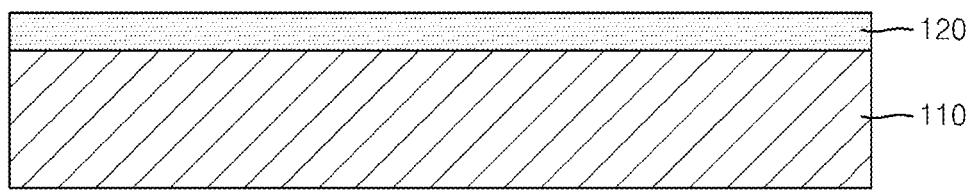
FIGS. 13A through 13H illustrate a method of manufacturing a photodiode according to at least one example embodiment.

Referring to FIG. 13A, first, the seed layer 120 is formed on the substrate 110. The substrate 110 may be formed of or include various materials such as a semiconductor material or a polymer material. Examples of the semiconductor material may include Si, Ge, GaAs, GaN, polymer, quartz, and glass. The seed layer 120 is formed of or includes the same as or similar material to a semiconductor material to be formed. However, the seed layer 120 may be omitted according to a material of the substrate 110 and the semiconductor material to be formed.

Figure 13B:
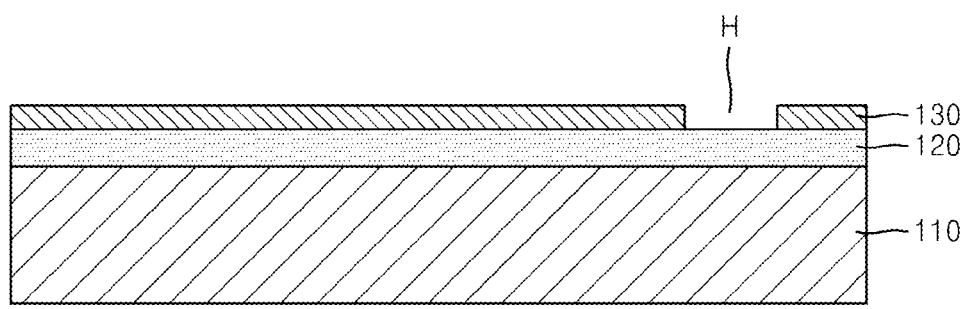

Referring to FIG. 13B, the insulation mask layer 130 is formed on the substrate 110. The insulation mask layer 130 is formed of or includes an insulation material such as a nitride or an oxide. A through hole H is formed in the insulation mask layer 130 so that a portion of the seed layer 120, or if the seed layer 120 is not formed, a portion of the substrate 110, is exposed through the through hole H.

Figure 13C:
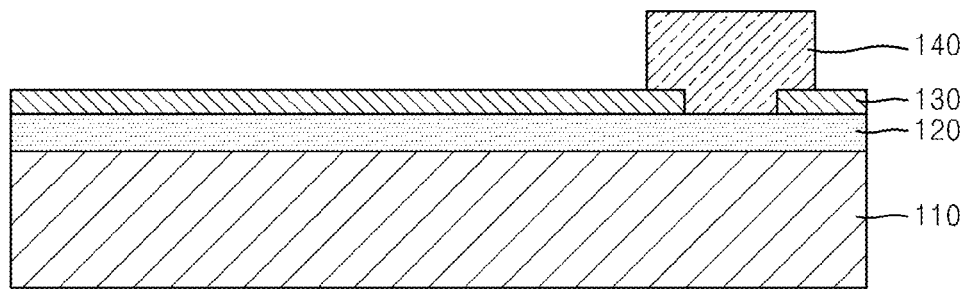

Referring to FIG. 13C, the first type semiconductor layer 140 is formed through the through hole H by using the insulation mask layer 130 as an ELOG mask. The first type semiconductor layer 140 may be formed of or include a group III-V compound semiconductor and may be a semiconductor layer doped with N-type impurities. Examples of the N-type impurities include Si, Ge, Se, and Te. The first type semiconductor layer 140 may be formed by using a typical semiconductor manufacturing process such as a HVPE method, a MBE method, a MOVPE method, a MOCVD method or the like. Also, a ratio of lateral growth with respect to vertical growth may be adjusted by adjusting process conditions. Regarding a defect occurring due to a difference in the materials of the substrate 110 and the first type semiconductor layer 140, that is, a defect generated due to a difference in lattice constants or coefficients of thermal expansion, evolution to an upper portion of the through hole H may not easily occur, and the first type semiconductor layer 140 formed by lateral overgrowth may have a small defect or small amount of defect.

Figure 13D:
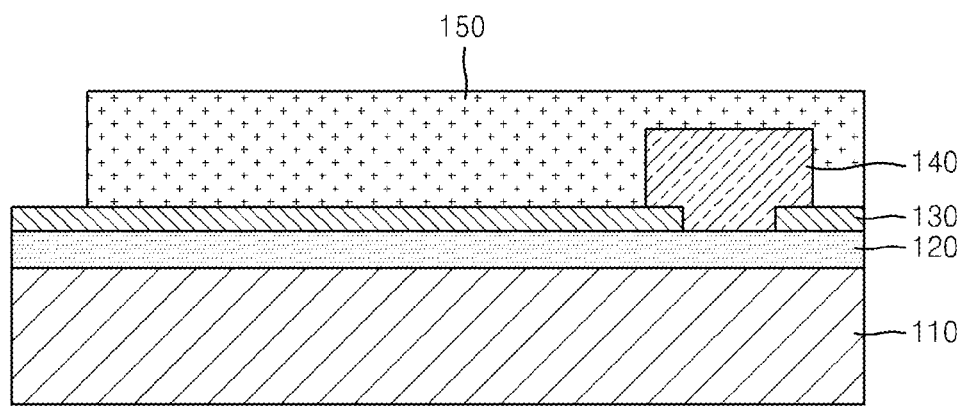

Next, as illustrated in FIG. 13D, the active layer 150 is formed by using an ELOG method. The active layer 150 is laterally grown from a lateral surface of the first type semiconductor layer 140 along a surface of the insulation mask layer 130. In the ELOG method, more lateral growth occurs than vertical growth. That is, when performing the ELOG method, as vertical growth is also performed, the active layer 150 is extended to the upper portion of the first type semiconductor layer 140. A direction of the ELOG method may be one of the directions illustrated in FIGS. 9 through 12.

Figure 13E:
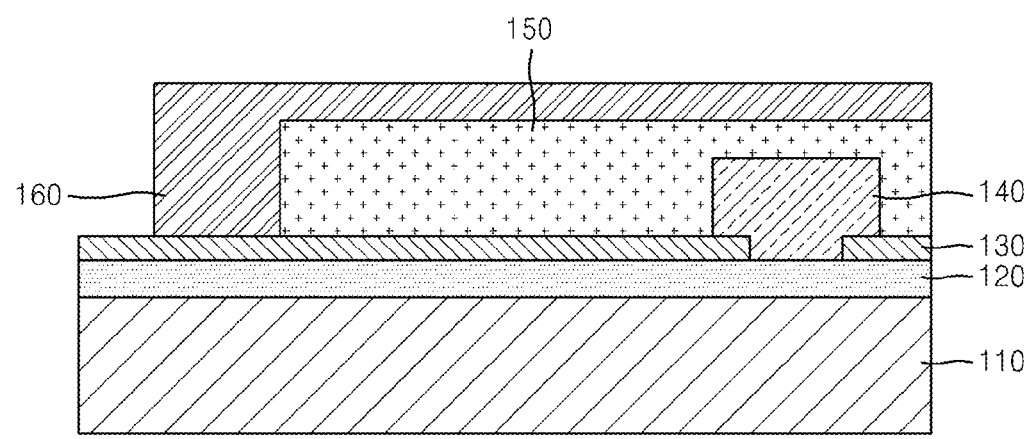

Next, as illustrated in FIG. 13E, the second type semiconductor layer 160 is formed by using the ELOG method. The second type semiconductor layer 160 may be formed of or include a group III-V compound semiconductor, and may be a semiconductor layer doped with P-type impurities. Examples of P-type impurities include Mg, Zn, and Be. The second type semiconductor layer 160 may be laterally grown from a lateral surface of the active layer 150 along a surface of the insulation mask layer 130. Meanwhile, when lateral grown is performed, vertical growth is also performed, and thus, the second type semiconductor layer 160 may be extended to an upper portion of the active layer 150.

Figure 13F:
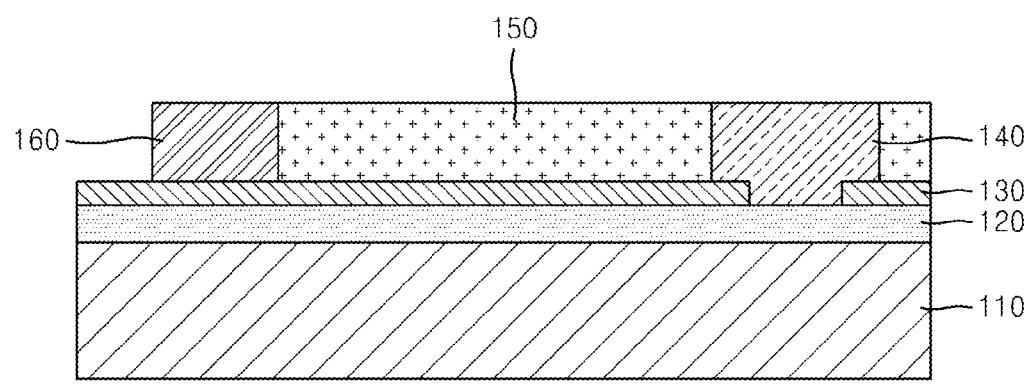

Next, as illustrated in FIG. 13F, a planarization operation is performed so that upper surfaces of the first type semiconductor layer 140, the active layer 150, and the second type semiconductor layer 160 are disposed on the same plane. A chemical mechanical polishing (CMP) process may be used as the planarization method.

Figure 13G:
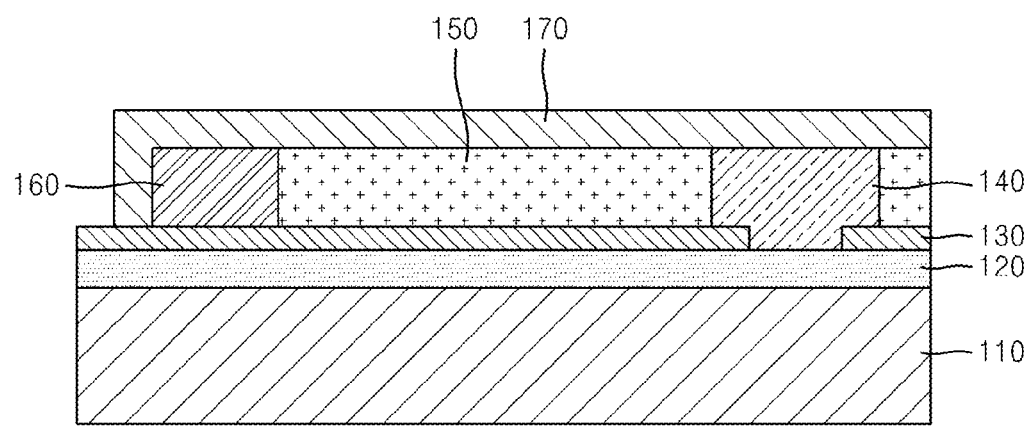

Next, as illustrated in FIG. 13G, the passivation layer 170 is formed. The passivation layer 170 may be formed of or include an insulation material such as a nitride, an oxide, a polyimide, or a photoresist.

Figure 13H:
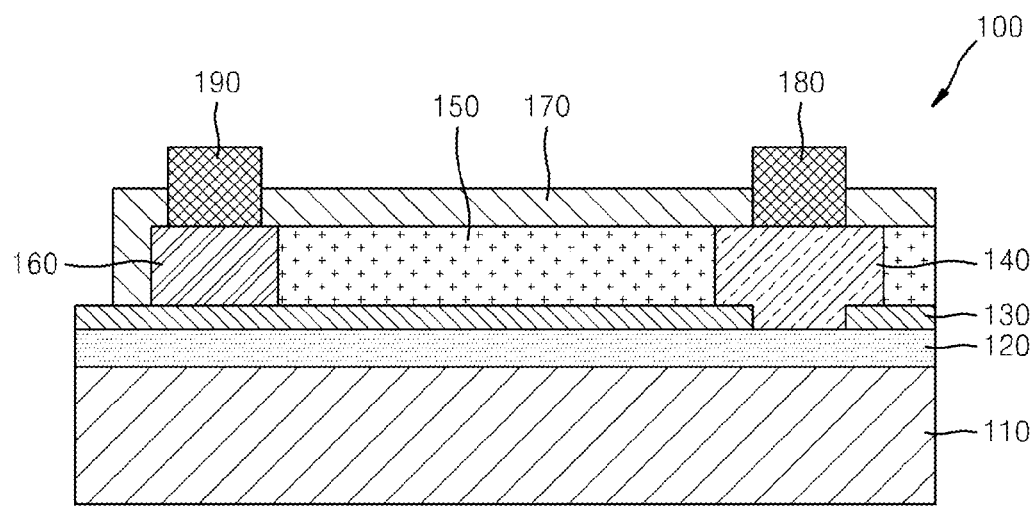

Next, the passivation layer 170 is patterned as illustrated in FIG. 13H so that portions of the first type semiconductor layer 140 and the second type semiconductor layer 160 are exposed, and then the first contact layer 180 and the second contact layer 190 respectively contacting the first type semiconductor layer 140 and the second type semiconductor layer 160 are formed.

The lateral type photodiode 100 may be manufactured according to the above-described example method. The lateral type photodiode 100 may be formed in a monolithic manner instead of by using a method in which the lateral type photodiode 100 is formed on another wafer on an insulation material from which a semiconductor material is typically not grown. The above method may be applied to methods of manufacturing various devices that use a photodiode.

FIGS. 14A through 14H illustrate a method of manufacturing an image sensor according to at least one example embodiment.

Figure 14A:
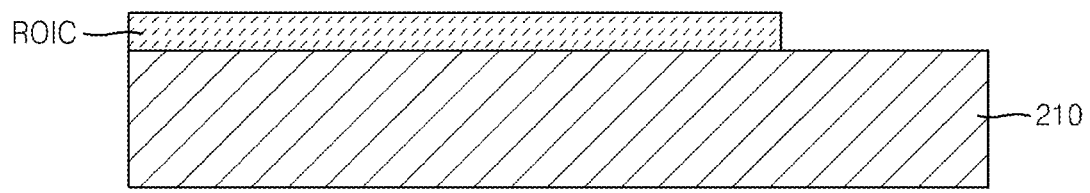
FIGS. 14A through 14H illustrate a method of manufacturing an image sensor according to at least one example embodiment.

Referring to FIG. 14A, first, the silicon substrate 210 on which a ROIC is formed is prepared. The ROIC may be a circuit that reads an output from a photodiode that is to be formed on the silicon substrate 210, and may include at least one transistor, capacitor, and wiring.

Figure 14B:
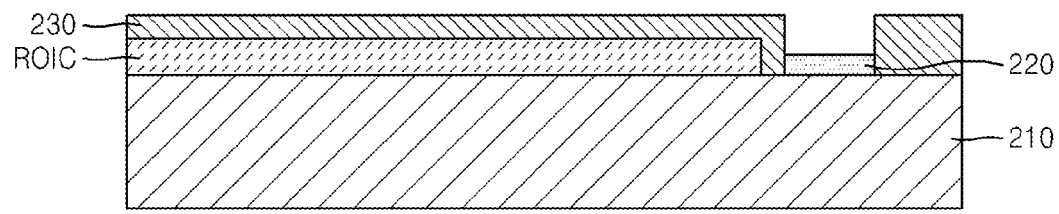

Referring to FIG. 14B, the insulation mask layer 230 is formed. The insulation mask layer 230 passivates the ROIC, and also functions as an ELOG mask. The insulation mask layer 230 is formed of or includes an insulation material such as a nitride or an oxide. A through hole H is formed in the insulation mask layer 230. The through hole H may have a circular, oval, polygonal or bar-shaped cross-section, as well as other cross-sections. For example, in order to induce lateral overgrowth in manners as illustrated in FIG. 9 or FIG. 12, the through hole H having a bar shaped cross-section may be formed. Alternatively, in order to induce lateral overgrowth as illustrated in FIG. 10 or FIG. 11, the through hole H having a circular or rectangular shape may be formed. The insulation mask layer 230 having the through hole H may be formed by using a deposition operation of an insulation material and a photolithography operation.

The seed layer 220 may be formed in the through hole H. The seed layer 220 may also be omitted.

Figure 14C:
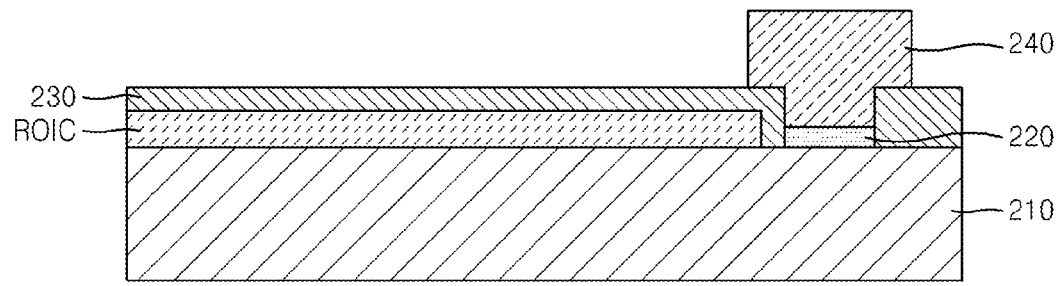

Referring to FIG. 14C, the first type semiconductor layer 240 is formed through the through hole H by using the insulation mask layer 230 as an ELOG mask. The first type semiconductor layer 240 may be formed of or include a group III-V compound semiconductor and may be a semiconductor layer doped with N-type impurities. Examples of the N-type impurities include Si, Ge, Se, and Te. The first type semiconductor layer 240 may be formed by using a typical semiconductor manufacturing process such as a HVPE method, a MBE method, a MOVPE method, a MOCVD method or the like. Also, a ratio of lateral growth with respect to vertical growth may be adjusted by adjusting process conditions. Regarding a defect occurring due to a difference in the materials of the substrate 210 and the first type semiconductor layer 240, that is, a defect generated due to a difference in lattice constants or coefficients of thermal expansion, evolution to an upper portion of the through hole H does not easily occur, and the first type semiconductor layer 240 formed by lateral overgrowth may have a small defect.

Figure 14D:
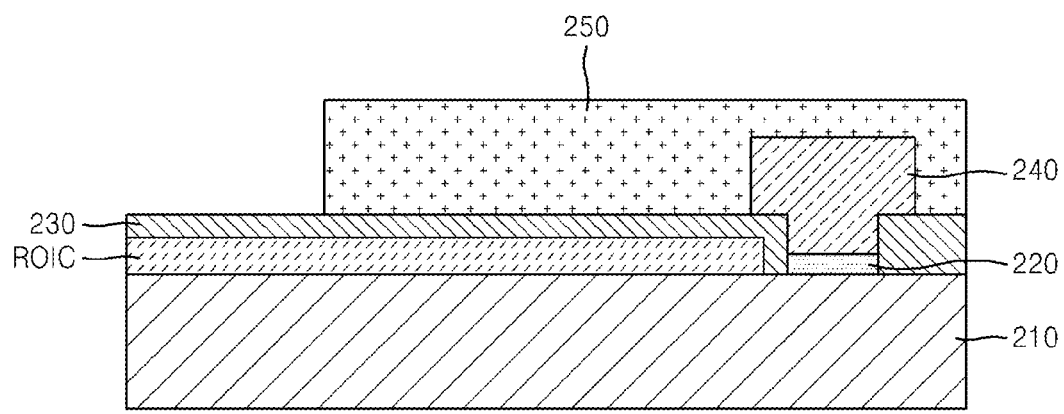

Next, as illustrated in FIG. 14D, the active layer 250 is formed by using an ELOG method. The active layer 250 is laterally grown from a lateral surface of the first type semiconductor layer 240 in a direction substantially parallel to a surface of the insulation mask layer 230. In the ELOG method, more lateral growth occurs than vertical growth. That is, when performing the ELOG method, as vertical growth is also performed, the active layer 250 is extended to the upper portion of the first type semiconductor layer 240. A direction of the ELOG method may be one of the directions illustrated in FIGS. 9 through 12.

Figure 14E:
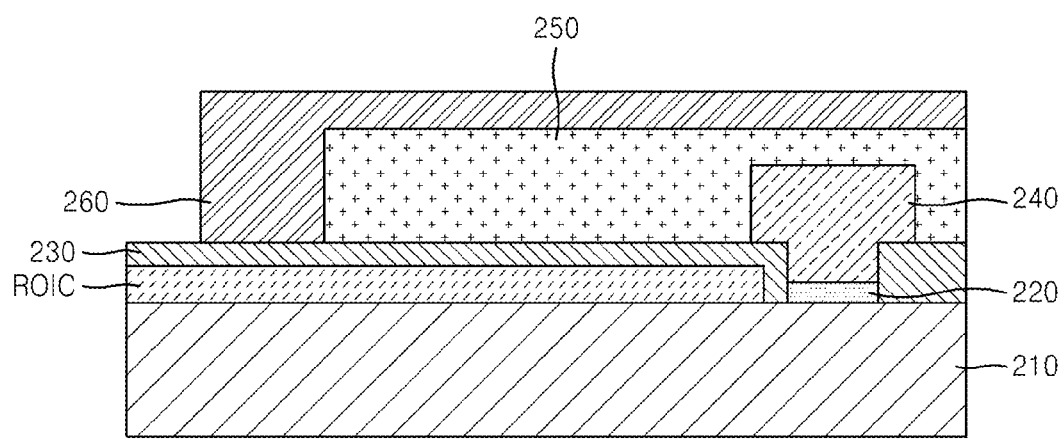

Next, as illustrated in FIG. 14E, the second type semiconductor layer 260 may be formed by using the ELOG method. The second type semiconductor layer 260 may be formed of or include a group III-V compound semiconductor, and may be a semiconductor layer doped with P-type impurities. Examples of the P-type impurities include Mg, Zn, and Be. The second type semiconductor layer 260 may be laterally grown from a lateral surface of the active layer 250 in a direction substantially parallel to a surface of the insulation mask layer 230. Meanwhile, when lateral grown is performed, vertical growth is also performed, and thus, the second type semiconductor layer 260 may be extended to an upper portion of the active layer 250.

Materials and composition ratios of the first type semiconductor layer 240, the active layer 250, and the second type semiconductor layer 260 are determined according to light of a wavelength band for which an image sensor to be manufactured is used. For example, the first type semiconductor layer 240 and the second type semiconductor layer 260 may be formed of or include InP, and the active layer 250 may be formed of or include InGaAs so as to sense infrared light.

Figure 14F:
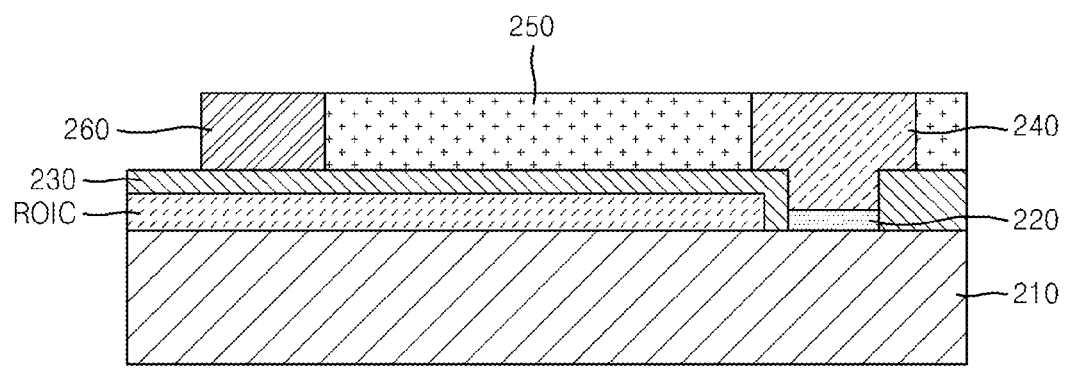

Next, as illustrated in FIG. 14F, a planarization operation is performed so that upper surfaces of the first type semiconductor layer 240, the active layer 250, and the second type semiconductor layer 260 are on substantially the same plane. A chemical mechanical polishing (CMP) process may be used as the planarization method.

Figure 14G:
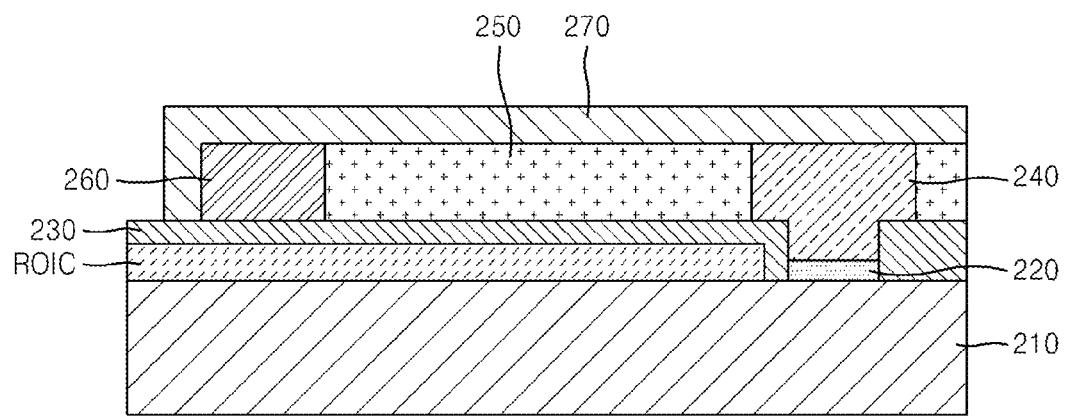

Next, as illustrated in FIG. 14G, the passivation layer 270 is formed. The passivation layer 270 may be formed of or include an insulation material such as a nitride, an oxide, a polyimide, or a photoresist.

Figure 14H:
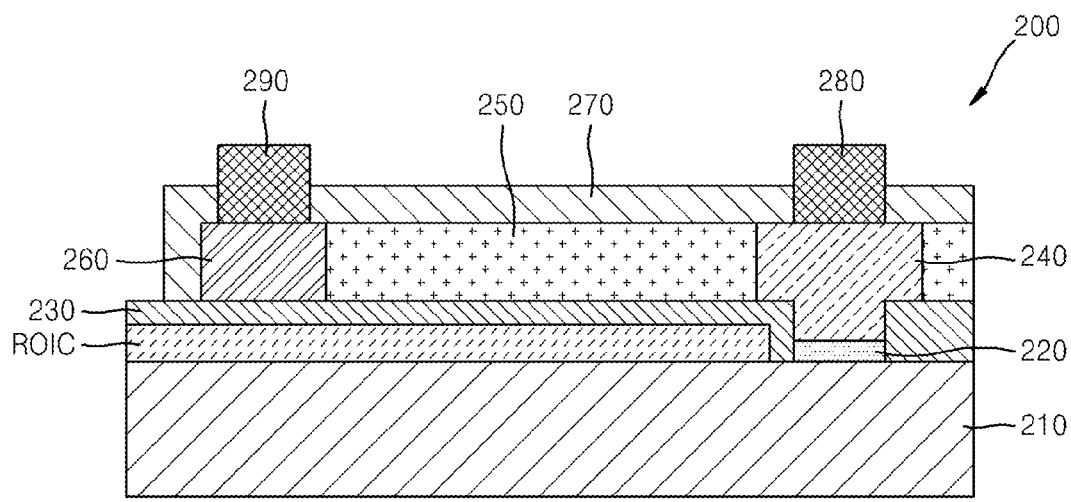

Next, the passivation layer 270 is patterned as illustrated in FIG. 14H so that portions of the first type semiconductor layer 240 and the second type semiconductor layer 260 are exposed, and then the first contact layer 280 and the second contact layer 290 respectively contacting the first type semiconductor layer 240 and the second type semiconductor layer 260 are formed.

Figure 15:
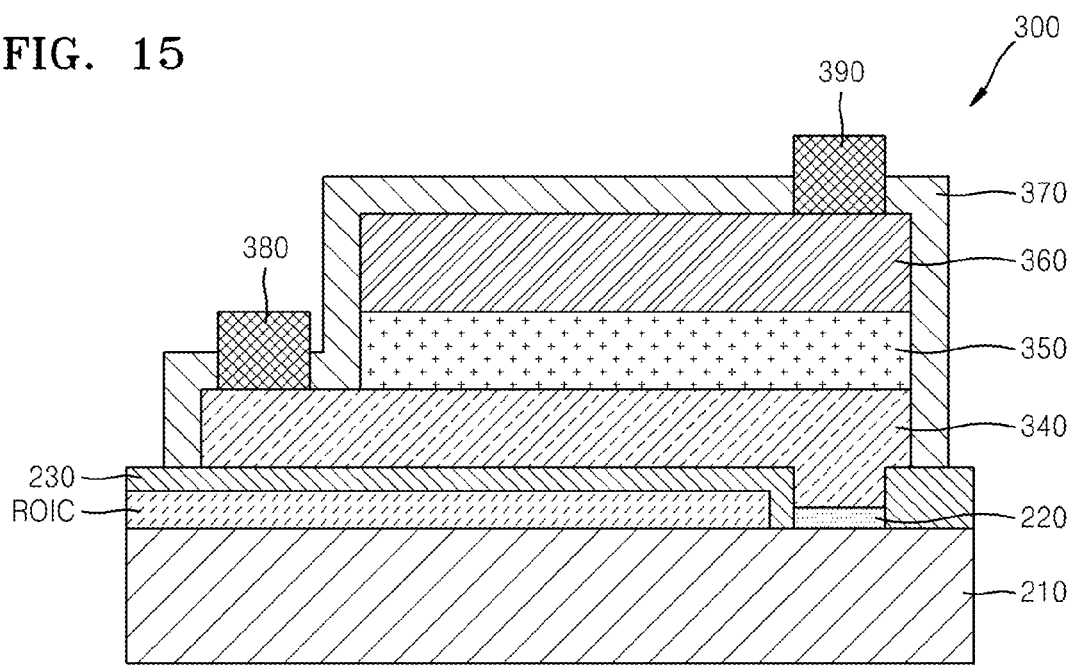
FIG. 15 is a schematic cross-sectional view illustrating a structure of an image sensor according to at least one example embodiment.

FIG. 15 is a schematic cross-sectional view illustrating a structure of an image sensor 300 according to at least one example embodiment.

The image sensor 300 includes a light receiving element and a ROIC that reads an electrical signal from the light receiving element and forms the electrical signal to an image. The light receiving element includes, on the insulation mask layer 230, a first type semiconductor layer 340, an active layer 350, and a second type semiconductor layer 360 that are stacked, for example sequentially stacked. Also, the image sensor 300 includes a passivation layer 370 that protects the first type semiconductor layer 340, the active layer 350, and the second type semiconductor layer 360 and a first contact layer 380 and a second contact layer 390 respectively contacting the first type semiconductor layer 340 and the second type semiconductor layer 360.

The image sensor 300 according to the example embodiment is a modified example of the image sensor 200 of FIG. 3. Compared to the image sensor 200, the image sensor 300 is different in that only the first type semiconductor layer 340 is laterally grown by using an ELOG method, and the second type semiconductor layer 360 is vertically grown on the first type semiconductor layer 340.

That is, the first type semiconductor layer 340 is grown from the seed layer 220 formed in the through hole H of the insulation mask layer 230 and extends laterally along an upper surface of the insulation mask layer 230 by using the ELOG method. The active layer 350 and the second type semiconductor layer 360 are stacked, for example sequentially stacked, on the first type semiconductor layer 340 by using a typical vertical growth method.

In the same manner as the image sensor 200 of FIG. 3, according to the image sensor 300 also, areas of the ROIC and the active layer 350 that are projected to a surface of the substrate 210 may be overlapped so as to minimize a cross-section of each pixel. The illustrated structure corresponds to a single pixel. According to the example embodiment, a size of a single pixel of the image sensor 300 may be reduced, or a surface area of a light receiving area in a single pixel of the image sensor 300 may be maximized.

The image sensor 300 has a plan view as illustrated in FIG. 4. That is, a plurality of pixels PX are included in an area on the substrate 210, and a photodiode PD and a ROIC are formed in each pixel area PX. The photodiode PD and the ROIC are disposed in different layers in a direction substantially perpendicular to the surface of the substrate 210. Thus, an area where the photodiode PD is formed in a single pixel PX is not affected by a size or a position of the ROIC. Accordingly, most of the area of the pixel PX may be used as a light receiving area.

FIGS. 16A through 16F illustrate a method of manufacturing the image sensor 300 of FIG. 15 according to at least one example embodiment.

Figure 16A:
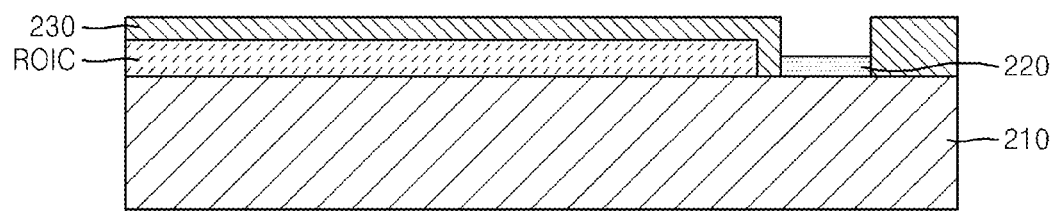
FIGS. 16A through 16F illustrate a method of manufacturing the image sensor of FIG. 15 according to at least one example embodiment.

As illustrated in FIG. 16A, the insulation mask layer 230 that passivates the ROIC is formed on the silicon substrate 210 on which the ROIC is formed, wherein the insulation mask layer 230 also functions as an ELOG mask as a through hole H is formed in the insulation mask layer 230. The seed layer 220 is formed in the through hole H. The seed layer 220 may be omitted.

Figure 16B:
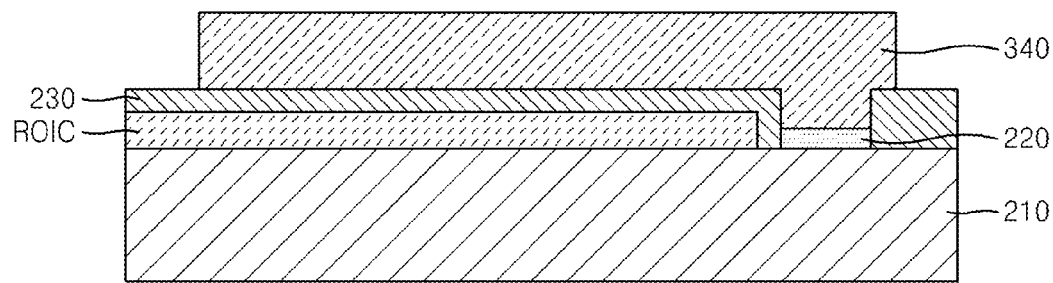

Next, as illustrated in FIG. 16B, the insulation mask layer 230 is used as an ELOG mask to form the first type semiconductor layer 340 through the through hole H by using a growth method such as the lateral overgrowth method. A degree of lateral overgrowth is such that the first type semiconductor layer 340 is laterally grown along the upper surface of the insulation mask layer 230 so as to face most portions of the ROIC.

Figure 16C:
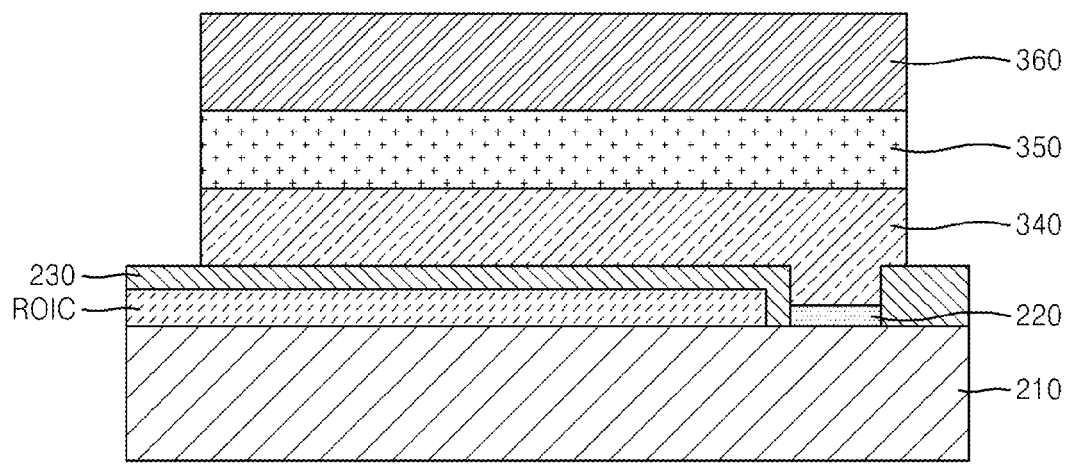

Next, as illustrated in FIG. 16C, the active layer 350 and the second type semiconductor layer 360 are formed, for example sequentially formed, on the first type semiconductor layer 340. Here, a typical vertical growth method is used.

Figure 16D:
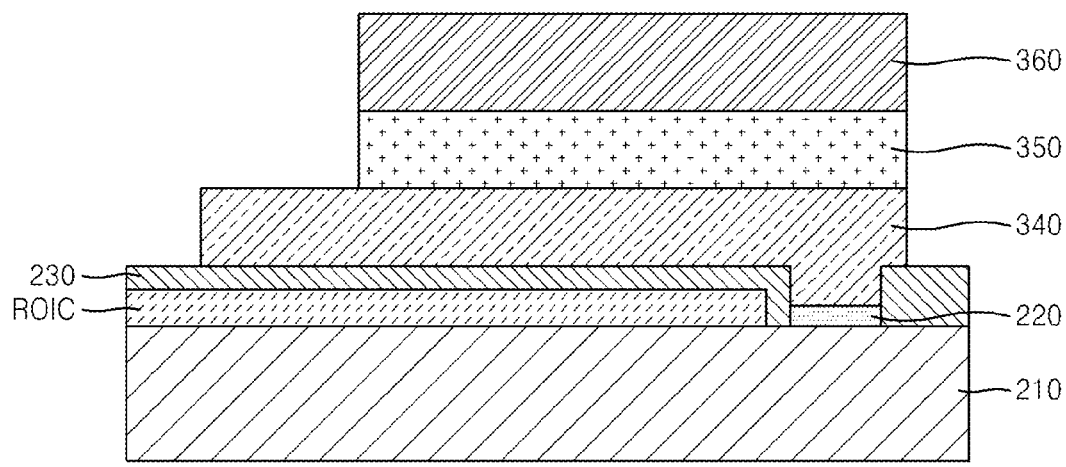

Next, as illustrated in FIG. 16D, portions of the second type semiconductor layer 360 and the active layer 350 are etched so that a portion of the first type semiconductor layer 340 is exposed.

Figure 16E:
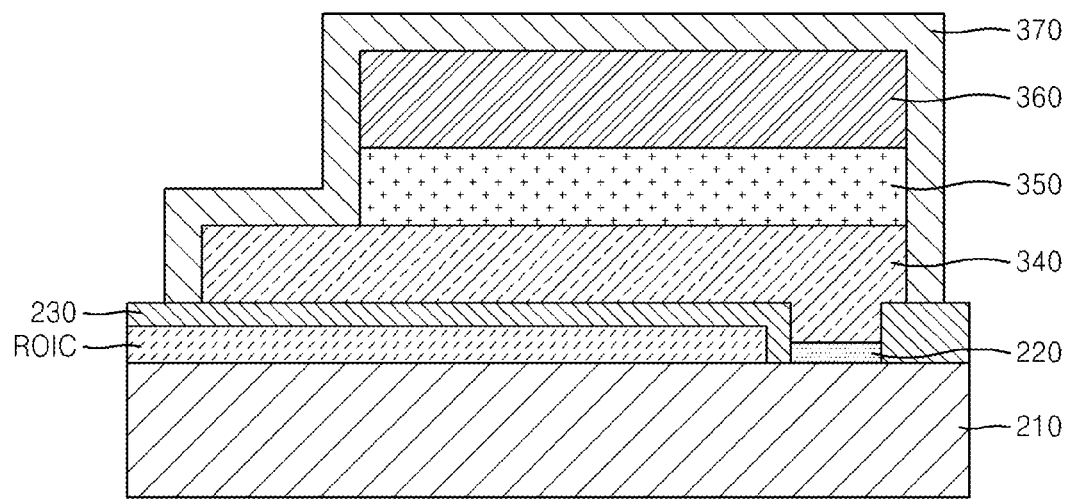

Next, as illustrated in FIG. 16E, the passivation layer 370 that protects the first type semiconductor layer 340, the active layer 350, and the second type semiconductor layer 360 is formed.

Figure 16F:
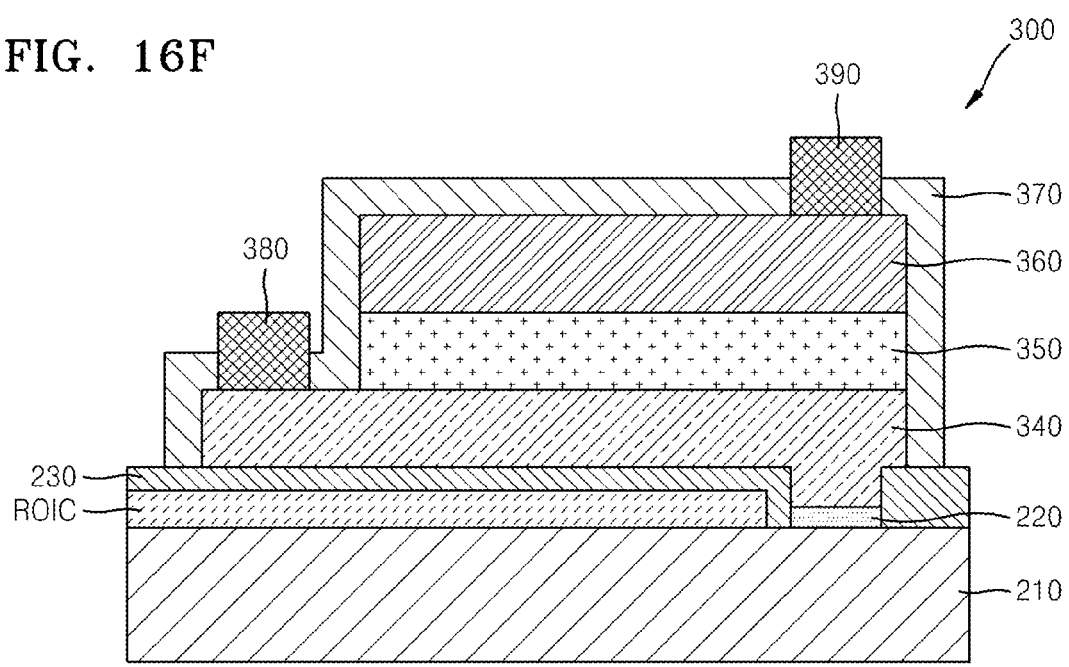

Next, as illustrated in FIG. 16F, the passivation layer 370 is patterned such that portions of the first type semiconductor layer 340 and the second type semiconductor layer 360 are exposed, and the first contact layer 380 and the second contact layer 390 respectively contacting the first type semiconductor layer 340 and the second type semiconductor layer 360 are formed.

The image sensor has a structure in which the ROIC and the photodiode are stacked, for example sequentially stacked, on a substrate, thereby providing a broad light receiving area.

According to the method of manufacturing the image sensor of the example embodiments, a semiconductor material may be laterally formed on an insulation layer by using a lateral overgrowth method. Thus, the image sensor having a broad light receiving area in a pixel may be manufactured.

It should be understood that the example embodiments described therein should be considered in a descriptive sense only and not for purposes of limitation. Descriptions of features within each example embodiment should typically be considered as available for other same or similar features in other example embodiments.

While one or more example embodiments have been described with reference to the figures, it will be understood by those of ordinary skill in the art that various changes in form and details may be made therein without departing from the spirit and scope of the example embodiments as defined by the following claims.

What is claimed is:

1. An image sensor comprising:
a silicon substrate;
a read out integrated circuit (ROIC) on the silicon substrate;
an insulation mask layer covering the ROIC and including at least one through hole, the through hole not exposing the ROIC;
a first type semiconductor layer extending from the through hole along a topmost surface of the insulation mask layer;
an active layer contacting the first type semiconductor layer; and
a second type semiconductor layer contacting the active layer.

2. The image sensor of claim 1, wherein the first type semiconductor layer, the active layer, and the second type semiconductor layer contact the topmost surface of the insulation mask layer and are arranged along a direction substantially parallel to the topmost surface of the insulation mask layer.

3. The image sensor of claim 2, wherein the active layer is configured to substantially surround a lateral surface of the first type semiconductor layer, and
wherein the second type semiconductor layer is configured to substantially surround a lateral surface of the active layer.

4. The image sensor of claim 2, wherein the active layer comprises two areas along two opposite lateral surfaces of the first type semiconductor layer, and
wherein the second type semiconductor layer comprises two areas at opposite ends of the two areas of the active layer from the first type semiconductor layer.

5. The image sensor of claim 1, wherein the first type semiconductor layer, the active layer and the second type semiconductor layer are on the topmost surface of the insulation mask layer and arranged along a direction substantially perpendicular to the topmost surface of the insulation mask layer.

6. The image sensor of claim 1, wherein the insulation mask layer comprises an oxide or a nitride.

7. The image sensor of claim 1, wherein the through hole comprises a seed layer.

8. The image sensor of claim 1, wherein projected areas of the ROIC and the active layer are overlapped.

9. The image sensor of claim 1, wherein at least one of the first type semiconductor layer, the active layer, and the second type semiconductor layer comprise a group III-V compound semiconductor material.

* * * * *